(12) United States Patent
Besshi et al.

(10) Patent No.: US 10,727,189 B2
(45) Date of Patent: Jul. 28, 2020

(54) POWER SEMICONDUCTOR DEVICE

(71) Applicant: Mitsubishi Electric Corporation, Chiyoda-ku, Tokyo (JP)

(72) Inventors: Noriyuki Besshi, Tokyo (JP); Ryuichi Ishii, Tokyo (JP); Masaru Fuku, Tokyo (JP); Yuji Fujimoto, Tokyo (JP); Yusuke Hirata, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 16/324,161

(22) PCT Filed: Aug. 28, 2017

(86) PCT No.: PCT/JP2017/030762
§ 371 (c)(1),
(2) Date: Feb. 8, 2019

(87) PCT Pub. No.: WO2018/047659
PCT Pub. Date: Mar. 15, 2018

(65) Prior Publication Data
US 2019/0206811 A1 Jul. 4, 2019

(30) Foreign Application Priority Data
Sep. 7, 2016 (JP) ................................. 2016-174352

(51) Int. Cl.
*H01L 23/64* (2006.01)
*H01L 23/48* (2006.01)
(Continued)

(52) U.S. Cl.
CPC .............. *H01L 23/64* (2013.01); *H01L 23/48* (2013.01); *H01L 24/48* (2013.01); *H01L 25/072* (2013.01);
(Continued)

(58) Field of Classification Search
CPC ......... H01L 23/64; H01L 25/18; H01L 23/48; H01L 29/7393; H01L 29/1095; H01L 2924/13055; H01L 2224/48247
See application file for complete search history.

(56) References Cited

U.S. PATENT DOCUMENTS

2016/0155687 A1* 6/2016 Takizawa ............ H01L 23/3735
257/666

FOREIGN PATENT DOCUMENTS

| JP | H1084009 A | 3/1998 |
|---|---|---|
| JP | 2000332179 A | 11/2000 |

(Continued)

OTHER PUBLICATIONS

International Search Report (PCT/ISA/210) dated Oct. 24, 2017, by the Japan Patent Office as the International Searching Authority for International Application No. PCT/JP2017/030762.

(Continued)

*Primary Examiner* — Julia Slutsker
(74) *Attorney, Agent, or Firm* — Buchanan Ingersoll & Rooney PC

(57) ABSTRACT

Provided is a power semiconductor device including a signal terminal and a power semiconductor element. The power semiconductor element is arranged on a substrate. The signal terminal includes a main body portion and a joint portion, and a part of the signal terminal is held by a terminal block. The joint portion includes a distal end portion and a base portion. The distal end portion includes a pad portion that is exposed from the terminal block and connected to a signal line. The base portion includes a thin portion in which a thickness in a vertical direction is set to be smaller than that of the pad portion. The thin portion has an upper surface that
(Continued)

is formed at a position lower than an upper surface of the pad portion and is covered with a resin material forming the terminal block.

20 Claims, 14 Drawing Sheets

(51) Int. Cl.
    *H01L 25/11*     (2006.01)
    *H01L 25/18*     (2006.01)
    *H01L 23/00*     (2006.01)
    *H01L 25/07*     (2006.01)
    *H01L 27/07*     (2006.01)
    *H01L 29/10*     (2006.01)
    *H01L 29/739*     (2006.01)
    *H01L 29/861*     (2006.01)
(52) U.S. Cl.
    CPC ............ *H01L 25/115* (2013.01); *H01L 25/18* (2013.01); *H01L 27/0711* (2013.01); *H01L 29/1095* (2013.01); *H01L 29/7393* (2013.01); *H01L 29/861* (2013.01); *H01L 2224/48091* (2013.01); *H01L 2224/48247* (2013.01); *H01L 2224/48472* (2013.01); *H01L 2924/00014* (2013.01); *H01L 2924/10253* (2013.01); *H01L 2924/1203* (2013.01); *H01L 2924/13055* (2013.01)

(56) References Cited

FOREIGN PATENT DOCUMENTS

| | | |
|---|---|---|
| JP | 2000349219 A | 12/2000 |
| JP | 2003142515 A | 5/2003 |
| JP | 2006108306 A | 4/2006 |

OTHER PUBLICATIONS

Written Opinion (PCT/ISA/237) dated Oct. 24, 2017, by the Japan Patent Office as the International Searching Authority for International Application No. PCT/JP2017/030762.

* cited by examiner

POWER SEMICONDUCTOR DEVICE

TECHNICAL FIELD

The present invention relates to a signal terminal of a power semiconductor device.

BACKGROUND ART

In a power semiconductor device in which wire bonding is performed, a semiconductor element is mounted on a substrate mounted on a heat radiating member, and a terminal block is arranged in a part of the semiconductor device so as to cover the substrate. A plurality of signal terminals are arranged in the terminal block. The signal terminal is a terminal configured to electrically connect the outside of the power semiconductor device and the semiconductor element to each other. Such signal terminal is fixed to the terminal block made of a resin material by insert molding or press fitting (see, for example, FIG. 6 of Patent Literature 1).

In this case, in a wire bonding step of connecting a pattern portion of the semiconductor element and a pad portion of the signal terminal to each other through a signal line, an ultrasonic signal is applied, and hence it is required to strongly hold the signal terminal. However, when the signal terminal is merely fixed to the terminal block by insert molding or press fitting, the signal terminal is resonated due to ultrasonic vibration, and a desired ultrasonic wave may not be applied. Therefore, in Patent Literature 1, a conical opening for exposing a part of the pad portion of the signal terminal is formed in the terminal block, and the entire periphery of the exposed surface is pressed with a resin material, to thereby prevent floating of the pad portion.

CITATION LIST

Patent Literature

[PTL 1] JP 2003-142515 A

SUMMARY OF INVENTION

Technical Problem

However, in the technology described in Patent Literature 1, the pad portion of the signal terminal and the resin material in the opening are merely brought into close contact with each other in a vertical direction. Thus, the vibration of the pad portion in a horizontal direction cannot be suppressed.

The present invention has been made to solve the above-mentioned problem, and therefore has an object to provide a power semiconductor device capable of suppressing vibration of a pad portion of a signal terminal.

Solution to Problem

A power semiconductor device according to an embodiment of the present invention includes a substrate, a power semiconductor element arranged on the substrate, a terminal block arranged on the substrate, a signal terminal held by a resin material forming the terminal block, and a signal line connected to the signal terminal and the power semiconductor element. The signal terminal includes a main body portion and a joint portion. The joint portion includes a distal end portion and a base portion, and the distal end portion includes a pad portion that is exposed from the terminal block and connected to the signal line. The base portion includes a thin portion in which a thickness in a vertical direction is set to be smaller than that of the pad portion. The thin portion has an upper surface formed at a position lower than an upper surface of the pad portion, and the upper surface of the thin portion is covered with a resin material forming the terminal block

Advantageous Effects of Invention

According to the power semiconductor device of an embodiment of the present invention, the holding force of the pad portion of the signal terminal can be improved without changing the creepage distance for insulation between the adjacent terminals. With this, a power semiconductor device capable of suppressing the vibration of the pad portion of the signal terminal can be provided.

DESCRIPTION OF EMBODIMENTS

Now, a power semiconductor device according to a preferred embodiment of the present invention is described with reference to the drawings.

First Embodiment

Figure 1:
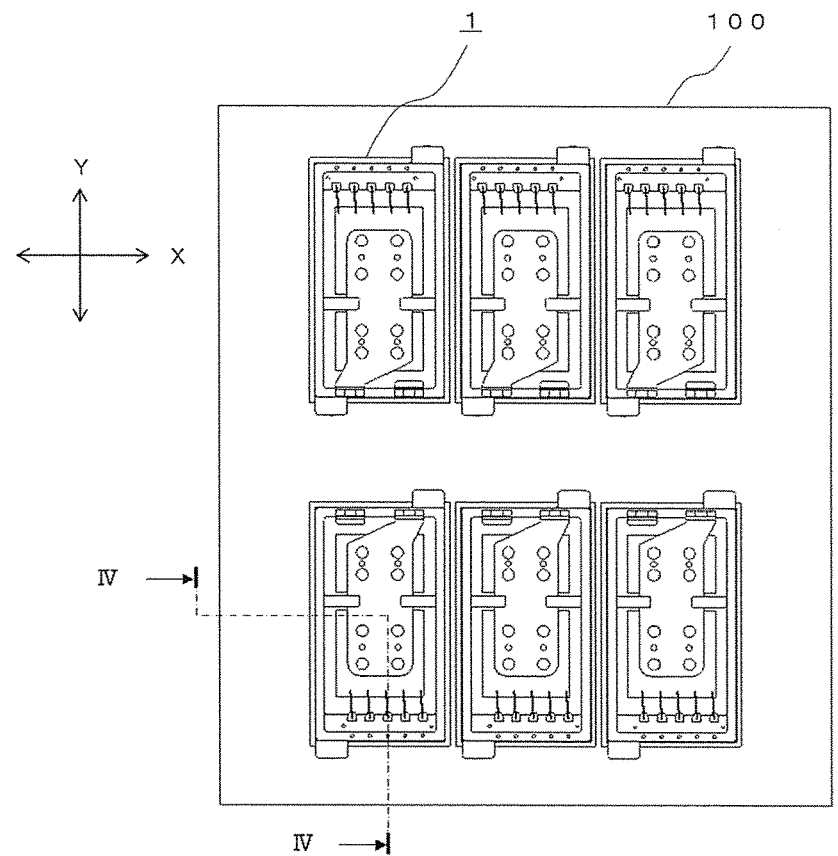
FIG. 1 is a schematic view of a plurality of power semiconductor devices according to a first embodiment of the present invention mounted on a heat radiating member.
Figure 2:
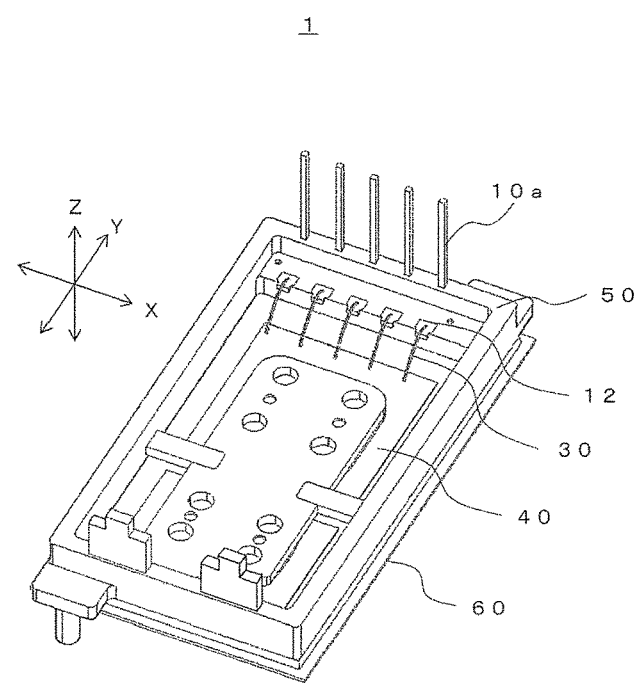
FIG. 2 is a perspective view of the power semiconductor device according to the first embodiment.

FIG. 1 is a schematic view of a plurality of power semiconductor devices 1 according to the present invention mounted on a heat radiating member 100. FIG. 2 is a perspective view of the power semiconductor device 1 according to a first embodiment of the present invention. As illustrated in FIG. 2, the power semiconductor device 1 includes a substrate 60, a terminal block 50, a power semiconductor element 40, signal terminals 10a, and signal lines 30. In a wire bonding step of the signal line 30, the signal line 30 is joined under a state in which a pad portion 12 is exposed upward as illustrated in FIG. 2. Therefore, herein, description is made under the assumption that the signal terminals 10a are directed upward.

The power semiconductor element 40 is formed of a combination of an insulated gate bipolar transistor (IGBT) and a diode. The power semiconductor element 40 is bonded onto a wiring pattern of the substrate 60 through use of a die bonding material. The power semiconductor element 40 has a thickness of from about 60 µm to about 200 µm in accordance with a required withstand voltage when the IGBT is made of silicon (Si). The terminal block 50 is bonded onto the substrate 60 with an adhesive. The terminal block 50 is made of a resin material 70 containing a heat-resistant resin as a main component so as to withstand soldering in a back-end process.

Figure 3A:
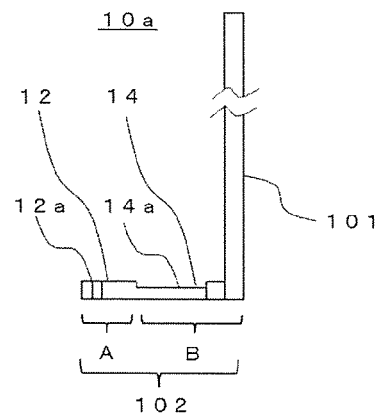
FIG. 3A is a side view of a signal terminal in the power semiconductor device according to the first embodiment.
Figure 3B:
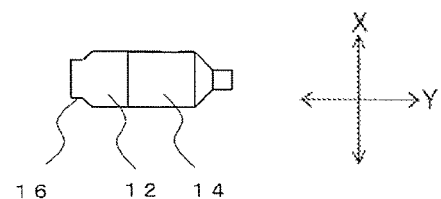
FIG. 3B is a top view of the signal terminal in the power semiconductor device according to the first embodiment.
Figure 3C:
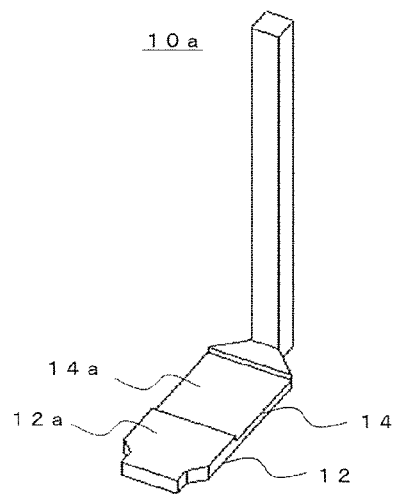
FIG. 3C is a perspective view of the signal terminal in the power semiconductor device according to the first embodiment.
Figure 4:
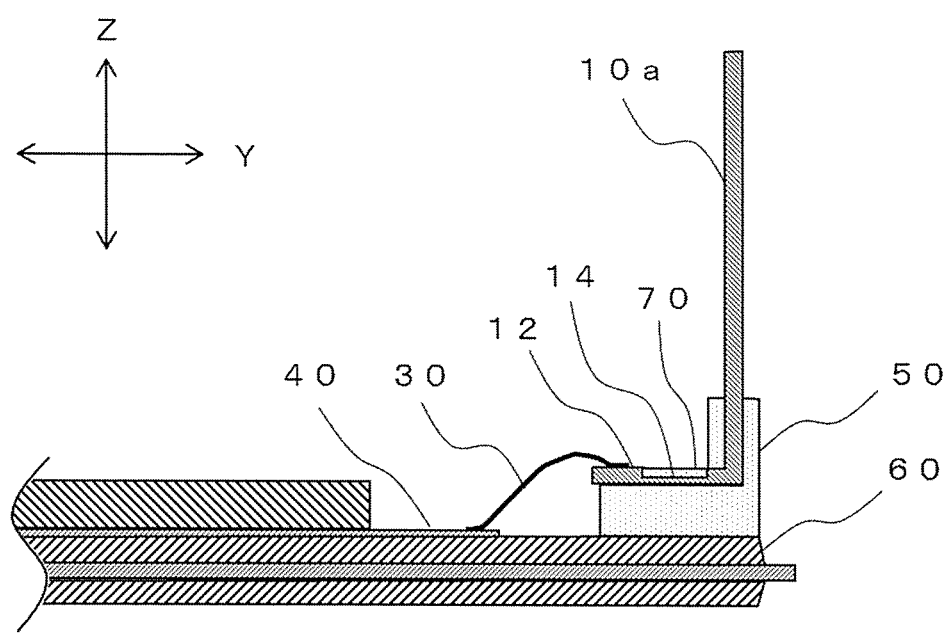
FIG. 4 is a sectional view of the power semiconductor device taken along the line IV-IV of FIG. 1.

FIG. 3A to FIG. 3C are a side view, a top view, and a perspective view for illustrating the signal terminal 10a of the power semiconductor device 1, respectively. FIG. 4 is a sectional view of the power semiconductor device 1 taken along the line IV-IV of FIG. 1. As illustrated in FIG. 3A, the signal terminal 10a includes a columnar main body portion 101 and a plate-like joint portion 102. The signal terminal 10a is subjected to insert molding at a time of formation of the terminal block 50. The signal terminal 10a is held by the terminal block 50 with a part of the main body portion 101 and a part of the joint portion 102 being covered with the resin material 70 forming the terminal block 50. The joint portion 102 includes a base portion B covered with the resin material 70 and a distal end portion A including the pad portion 12. An upper surface 12a of the pad portion 12 is exposed from the terminal block 50 and joined to the signal line 30. The signal terminal 10a is made of copper or brass in consideration of the resistance to vibration and the effect of heat in the back-end process. Further, the signal terminal 10a is subjected to Sn plating, Ni plating, or other surface treatment in order to prevent oxidation.

The signal lines 30 are configured to connect five kinds of low-voltage terminals of the power semiconductor element 40 and the signal terminals 10a to each other. The five kinds of low-voltage terminals include a gate terminal and an emitter terminal of an IGBT element of the power semiconductor element 40, an anode terminal and a cathode terminal of a temperature sensing diode built in the power semiconductor element 40, and a current sensor terminal built in the power semiconductor element 40. The signal line 30 is joined to the pattern portion formed on the surface of the power semiconductor element 40 and the pad portion 12 of the signal terminal 10a through wire bonding.

In wire bonding, the signal line 30 is pressed against the pattern portion of the power semiconductor element 40 and the pad portion 12 of the signal terminal 10a, and ultrasonic vibration is applied in a Y direction of FIG. 3B. Then, a newly-formed surface is formed between the pattern portion and the signal line 30 and between the pad portion 12 and the signal line 30, and the signal line 30 is joined to the pattern portion and the pad portion 12 through adhesion.

In this case, when the signal terminal 10a is not held by the terminal block 50 sufficiently, the pad portion 12 and the signal line 30 are resonated in the Y direction due to ultrasonic vibration, and a joint failure occurs without the newly-formed surface being formed. Thus, it is required to hold the signal terminal 10a so that pad portion 12 is not vibrated.

As illustrated in FIG. 3B, in the signal terminal 10a in the first embodiment, the distal end portion A of the joint portion 102 includes a narrow portion 16 in which a width in an X direction illustrated in FIG. 1 and FIG. 2 is reduced. Further, the resin material 70 forming the terminal block 50 is filled into a part obtained by reducing the width in the narrow portion 16. With this, the vibration in the Y direction of the pad portion 12 is suppressed. Further, in the signal terminal 10a, the base portion B of the joint portion 102 includes a thin portion 14 in which a thickness in the vertical direction is set to be smaller than that of the pad portion 12. Then, an upper surface 14a of the thin portion 14 is covered with the resin material 70 forming the terminal block 50 so that an upper surface of the resin material 70 becomes lower than the upper surface 12a of the pad portion 12, and thus the suppressing force of the vibration in the Y direction of the pad portion 12 is increased.

Now, the reason for setting the upper surface of the resin material 70 covering the upper surface 14a of the thin portion 14 to be lower than the upper surface 12a of the pad portion 12 is described.

The wire bonding of the signal line 30 is performed through use of an ultrasonic tool 200 including a cutter 201. FIG. 15A to FIG. 15G are views for illustrating a series of steps of performing wire bonding of the signal line 30 in sequence. The contents of each step illustrated in FIG. 15A to FIG. 15G are described below.

(FIG. 15A) The signal line 30 is brought into contact with the upper surface 12a of the pad portion 12 of the signal terminal 10a under pressure through use of the ultrasonic tool 200.

(FIG. 15B) The upper surface 12a of the pad portion 12 and the signal line 30 are joined to each other by application of ultrasonic vibration generated in the ultrasonic tool 200.

(FIG. 15C) The pressurization by the ultrasonic tool 200 is removed.

(FIG. 15D) The ultrasonic tool 200 is moved to the signal terminal 10a side.

(FIG. 15E) The cutter 201 is brought into abutment against the signal line 30. A blade of the cutter 201 is inserted into the signal line 30 from a half of a diameter to about 70% of the diameter of the signal line 30 as a guideline.

(FIG. 15F) The cutter 201 is retracted. The signal line 30 is deformed in a portion in which the cutter 201 has been inserted, and a minute burr-like protrusion is formed in a lower portion on the signal terminal 10a side.

(FIG. 15G) The ultrasonic tool 200 is moved upward. Then, the signal line 30 is pulled up to be cut.

Figure 15A:
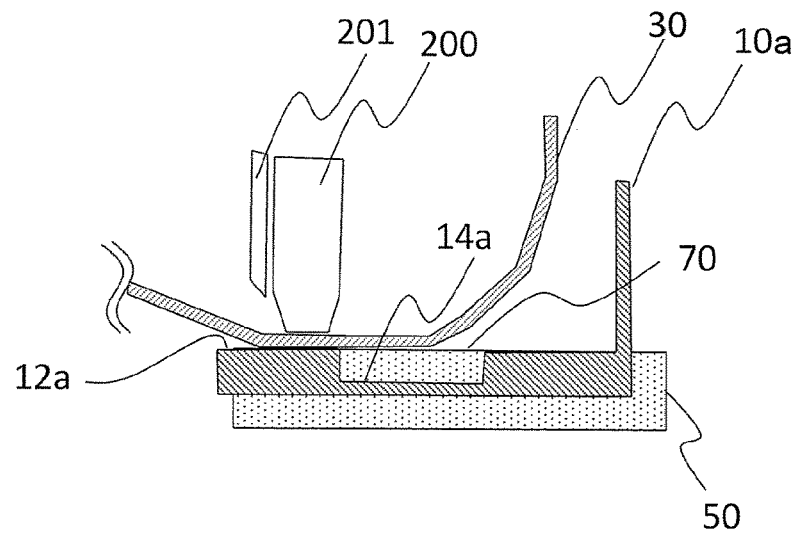
FIG. 15A is a view for illustrating a state in which a signal line is pressurized with an ultrasonic tool in a wire bonding step of the signal terminal.
Figure 15B:
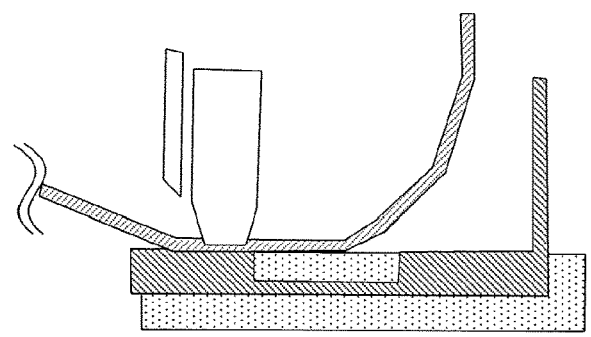
FIG. 15B is a view for illustrating a state in which the ultrasonic tool is excited in the wire bonding step of the signal terminal.
Figure 15C:
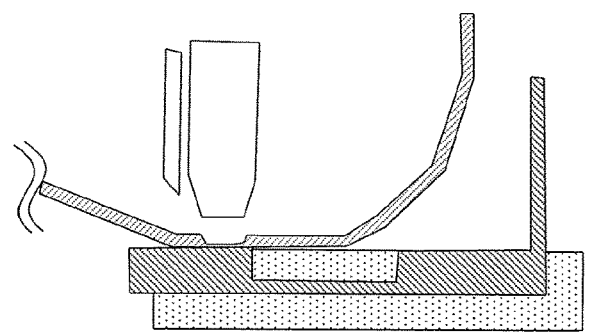
FIG. 15C is a view for illustrating a state in which the ultrasonic tool is unloaded in the wire bonding step of the signal terminal.
Figure 15D:
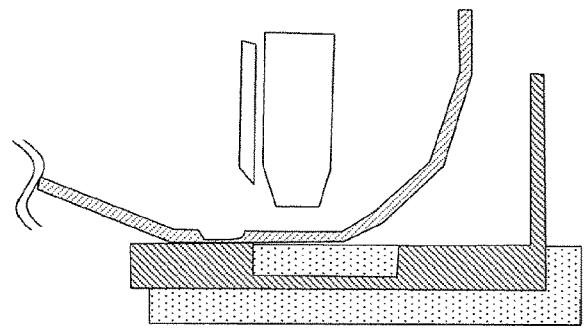
FIG. 15D is a view for illustrating a state in which the ultrasonic tool is moved in the wire bonding step of the signal terminal.
Figure 15E:
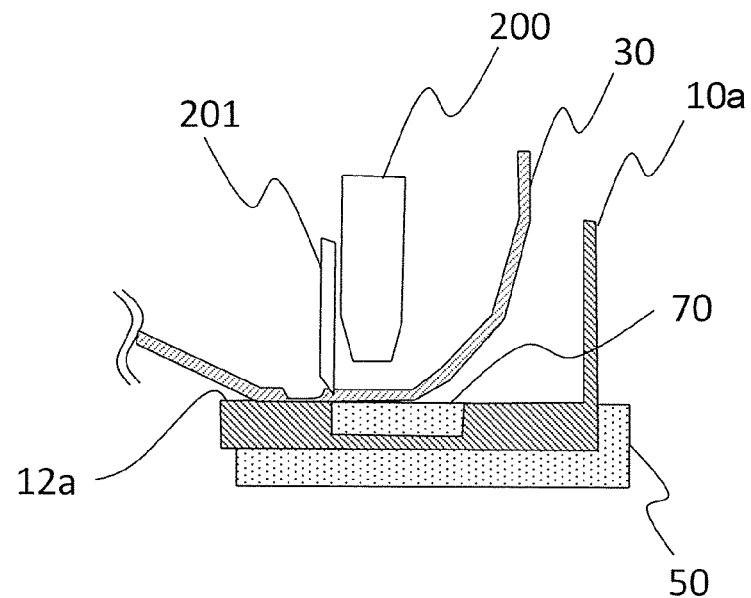
FIG. 15E is a view for illustrating a state in which a cutter is inserted into the signal line in the wire bonding step of the signal terminal.
Figure 15F:
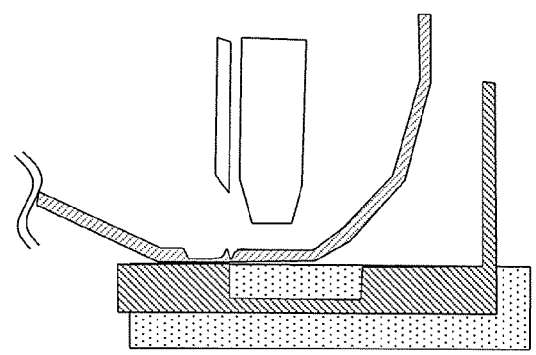
FIG. 15F is a view for illustrating a state in which the cutter is retracted in the wire bonding step of the signal terminal.
Figure 15G:
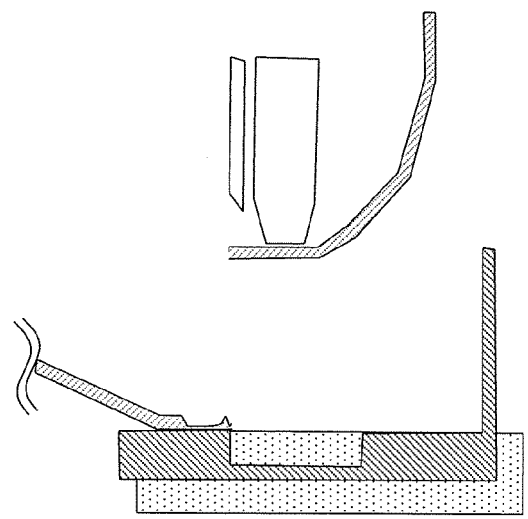
FIG. 15G is a view for illustrating a state in which the signal line is cut off in the wire bonding step of the signal terminal.
Figure 16A:
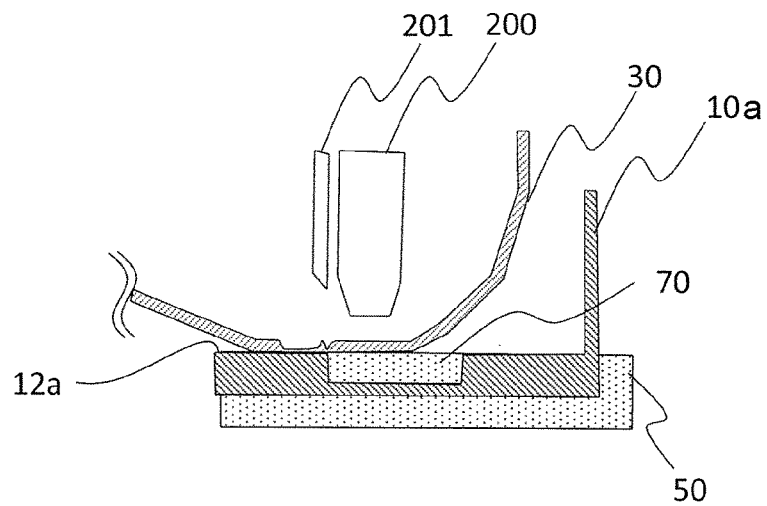
FIG. 16A is a view for illustrating a state in which the cutter is retracted when a resin material covering an upper surface of a thin portion of the signal terminal is higher than an upper surface of a pad portion.
Figure 16B:
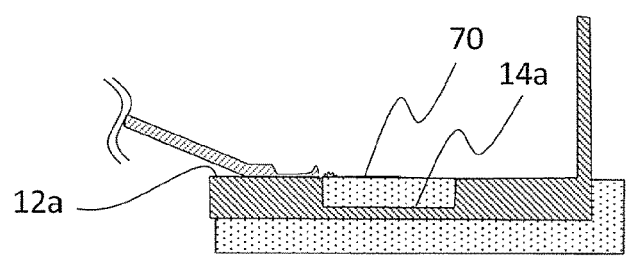
FIG. 16B is a view for illustrating a state in which the signal line is cut off when the resin material covering the upper surface of the thin portion of the signal terminal is higher than the upper surface of the pad portion.

FIG. 16A and FIG. 16B are views for illustrating the step of FIG. 15F and the step of FIG. 15G when the upper surface of the resin material 70 covering the upper surface 14a of the thin portion 14 is higher than the upper surface 12a of the pad portion 12. Meanwhile, FIG. 17A and FIG. 17B are views for illustrating the step of FIG. 15F and the step of FIG. 15G when the upper surface of the resin material 70 covering the upper surface 14a of the thin portion 14 is lower than the upper surface 12a of the pad portion 12.

As illustrated in FIG. 16A and FIG. 16B, when the upper surface of the resin material 70 is higher than the upper surface 12a of the pad portion 12, the protrusion formed in the signal line 30 may be brought into contact with an angular portion of the resin material 70. Then, the resin material 70 may be chipped off to scatter. When the chipped resin material 70 scatters, there is a risk in that joining in the subsequent wire bonding step may be inhibited. There is also a risk in that a required insulation distance may not be kept in the thin portion 14.

Figure 17A:
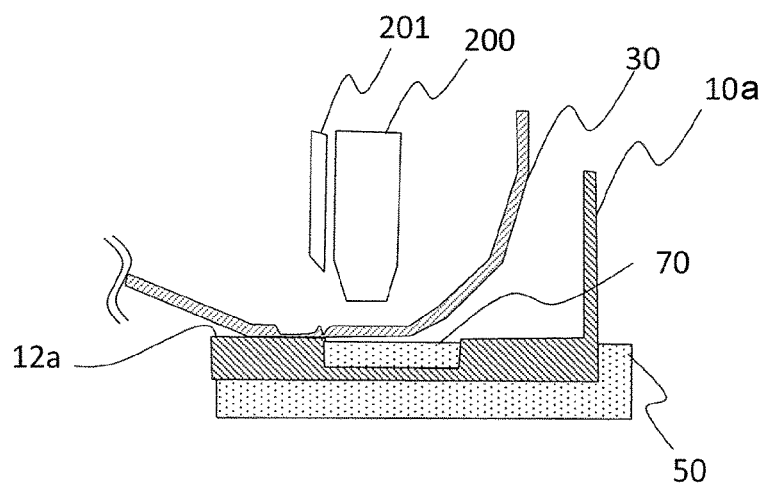
FIG. 17A is a view for illustrating a state in which the cutter is retracted when the resin material covering the upper surface of the thin portion of the signal terminal is lower than the upper surface of the pad portion.
Figure 17B:
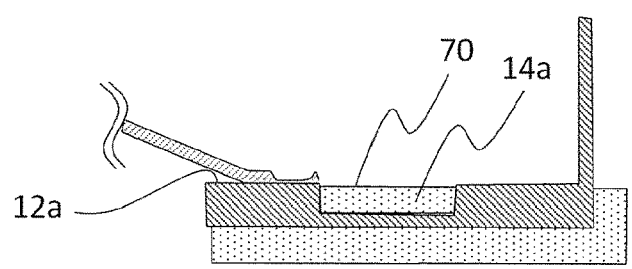
FIG. 17B is a view for illustrating a state in which the signal line is cut off when the resin material covering the upper surface of the thin portion of the signal terminal is lower than the upper surface of the pad portion.

Meanwhile, when the upper surface of the resin material 70 is set to be lower than the upper surface 12a of the pad portion 12 as illustrated in FIG. 17A and FIG. 17B, the protrusion formed in the signal line 30 can be prevented from being brought into contact with the resin material 70. With this, the chipped resin material 70 can be prevented from scattering. Thus, joining in the subsequent wire bonding step is not inhibited. Further, there is no risk in that the required insulation distance is not kept in the thin portion 14. The foregoing is the reason for setting the upper surface of the resin material 70 covering the upper surface 14a of the thin portion 14 to be lower than the upper surface 12a of the pad portion 12.

It is preferred that an angular portion extending from the upper surface 12a of the pad portion 12 to the upper surface 14a of the thin portion 14 be subjected to C-surface processing, and an end portion of a die for molding the terminal block 50 be brought closer to the upper surface 14a of the thin portion 14 than to the upper surface 12a of the pad portion 12. With this, the upper surface of the resin material 70 covering the thin portion 14 can be reliably set to be lower than the upper surface 12a of the pad portion 12.

The narrow portion 16 is formed so as to have a width smaller than that of the pad portion 12. It is preferred that the width of the narrow portion 16 be set to a half or less of that of the pad portion 12. The thickness of the thin portion 14 is set to 85% or less of that of the pad portion 12, and the upper surface 14a is covered with the resin material 70. It is more preferred that the thickness of the thin portion 14 be set to 50% to 70% of that of the pad portion 12. As just described, with the power semiconductor device 1 according to the first embodiment, the vibration in the Y direction of the signal terminal 10a can be suppressed without changing the creepage distance for insulation between the adjacent signal terminals 10a. In the first embodiment, both the narrow portion 16 and the thin portion 14 are formed in the joint portion 102 of the signal terminal 10a, but only the thin portion 14 may be formed.

In this case, the stability of wire bonding contributes to the adhesion strength between the resin material 70 forming the terminal block 50 and the signal terminal 10a. In view of this, as the kind of the resin material 70 and the material for the signal terminal 10a, it is required to select those having sufficient heat resistance in consideration of the highest temperature of the environment in which the power semiconductor device is used and the heating process after wire bonding.

Examples of the resin material 70 include polyphenylene sulfide (PPS) and liquid crystal polymer (LCP). LCP is advantageous in consideration of heat resistance, but the adhesion degree with respect to the signal terminal 10a may not be sufficiently obtained in the case of LCP as compared to PPS. In the power semiconductor device 1 according to the first embodiment, the thin portion 14 is formed in the signal terminal 10a, and hence the adhesion degree between the resin material 70 and the signal terminal 10a can be improved.

Further, a presser claw may be formed on a facility side of wire bonding in addition to the thin portion 14, and the vicinity of the wire bonding portion may be pressed with the presser claw. With this, a further stable wire bonding state can be obtained.

Second Embodiment

Figure 5A:
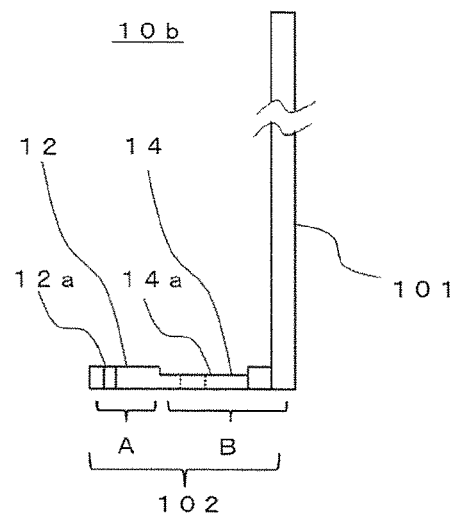
FIG. 5A is a side view of a signal terminal in a power semiconductor device according to a second embodiment of the present invention.
Figure 5B:
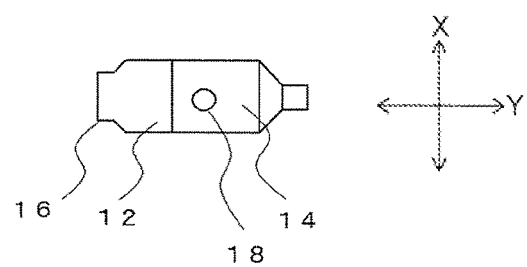
FIG. 5B is a top view of the signal terminal in the power semiconductor device according to the second embodiment.
Figure 5C:
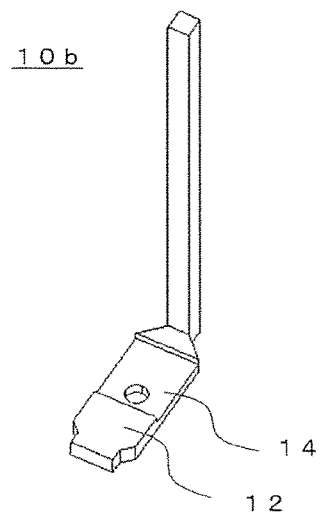
FIG. 5C is a perspective view of the signal terminal in the power semiconductor device according to the second embodiment.
Figure 6:
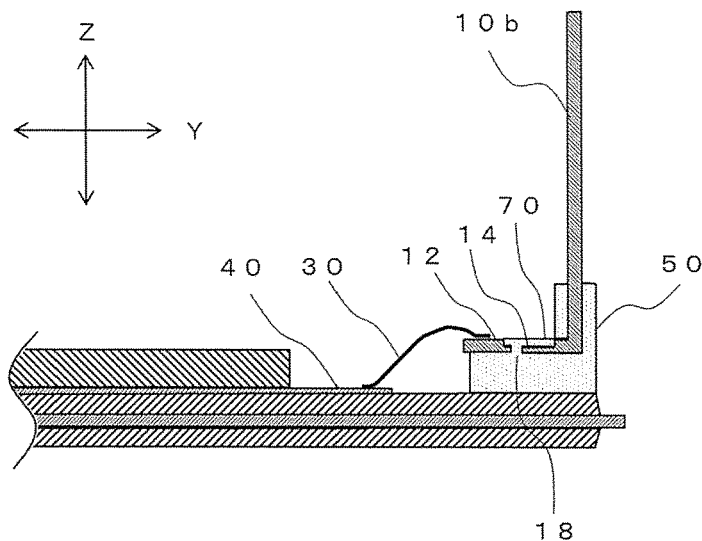
FIG. 6 is a sectional view of the power semiconductor device according to the second embodiment.

FIG. 5A to FIG. 5C area side view, a top view, and a perspective view for illustrating a signal terminal 10b in a second embodiment of the present invention, respectively. FIG. 6 is a sectional view of a power semiconductor device 1 using the signal terminal 10b. The power semiconductor device 1 according to the second embodiment is the same as in the first embodiment except that the shape of the signal terminal 10b is different.

As illustrated in FIG. 5A, the signal terminal 10b in the second embodiment includes the columnar main body portion 101 and the plate-like joint portion 102. As illustrated in FIG. 5B, the distal end portion A of the joint portion 102 includes the narrow portion 16, and the base portion B includes the thin portion 14.

In the signal terminal 10b in the second embodiment, the thin portion 14 has a through hole 18 penetrating through the thin portion 14 in a Z direction. The inside of the through hole 18 is filled with the resin material 70 forming the terminal block 50, with the result that the movement of the base portion B of the signal terminal 10b in the XY plane is inhibited. Thus, the vibration of the pad portion 12 of the signal terminal 10b in all the directions in the XY plane is suppressed.

In this case, it is preferred that the angle of each of the signal lines 30 connecting each of the joint portions on the power semiconductor element 40 and the pad portion 12 of each of the signal terminals 10 be the same as illustrated in FIG. 2 in consideration of a manufacturing apparatus and the stability of product quality. However, when the angle of each of the signal lines 30 is set to be the same in the power semiconductor device 1, which is required to be downsized, there is constraint in terms of size for downsizing, and hence, the angle of each of the signal lines 30 may be varied in some cases. When the angle of each of the signal lines 30 is varied, the excitation direction by wire bonding is varied depending on the signal line 30. Thus, vibration having a different direction is applied depending on the pad portion 12. Thus, with the signal terminal 10b in the second embodiment, even when the angle of each of the signal lines 30 is varied, the vibration of the pad portion 12 in all the directions in the XY plane can be suppressed. Thus, a joint failure of wire bonding can be reduced.

Figure 7:
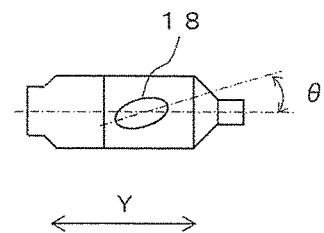
FIG. 7 is a top view for illustrating a modification example of the signal terminal in the power semiconductor device according to the second embodiment.

In the second embodiment, the through hole 18 is formed into a circular shape, but the present invention is not limited thereto. The through hole 18 may have an elliptical shape, an elongated hole shape, a triangular shape, a rectangular shape, or other polygonal shape, for example. When the through hole 18 is formed into an elliptical shape or an elongated hole shape, in the case where the through hole 18 is formed so that the Y direction being the excitation direction of wire bonding and the long-axis direction of the through hole 18 have a suitable angle θ as illustrated in FIG. 7, a further vibration suppressing effect is obtained.

Third Embodiment

Figure 8:
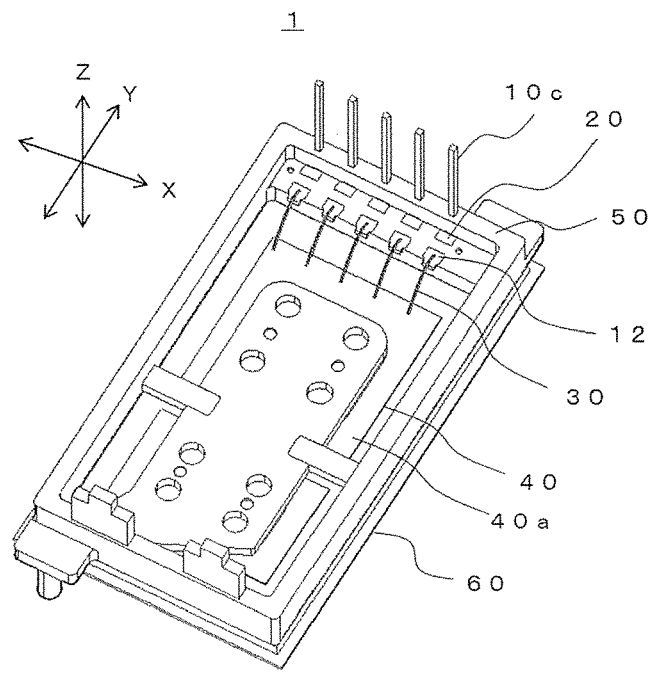
FIG. 8 is a perspective view of a power semiconductor device according to a third embodiment of the present invention.
Figure 9A:
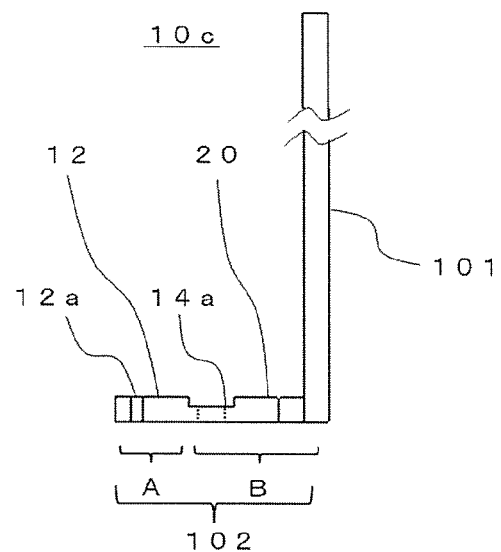
FIG. 9A is s side view of a signal terminal in the power semiconductor device according to the third embodiment.
Figure 9B:
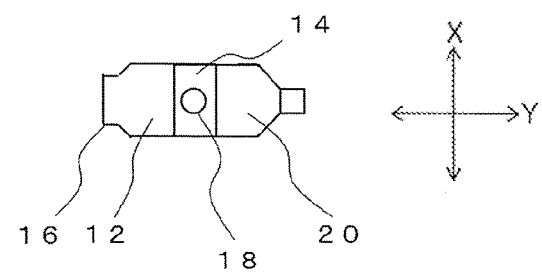
FIG. 9B is a top view of the signal terminal in the power semiconductor device according to the third embodiment.
Figure 9C:
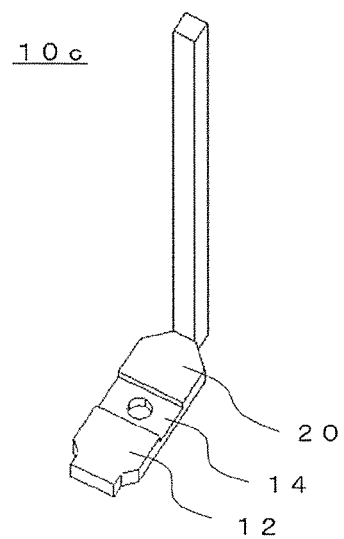
FIG. 9C is a perspective view of the signal terminal in the power semiconductor device according to the third embodiment.
Figure 10:
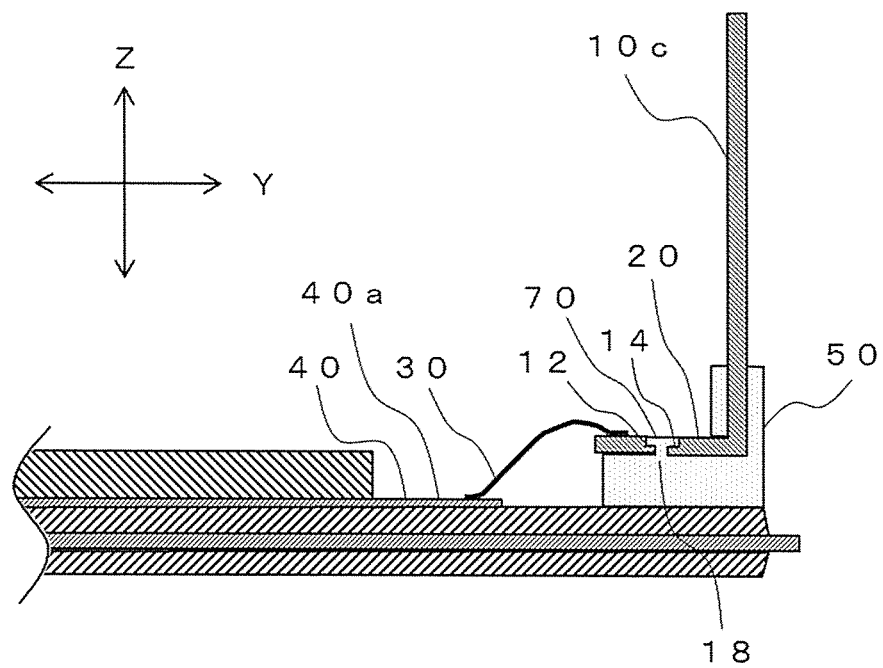
FIG. 10 is a sectional view of the power semiconductor device according to the third embodiment.

FIG. 8 is a schematic view of a power semiconductor device 1 according to a third embodiment of the present invention. FIG. 9A to FIG. 9C are a side view, a top view, and a perspective view of a signal terminal 10c of FIG. 8, respectively. FIG. 10 is a sectional view of the power semiconductor device 1 according to the third embodiment. The power semiconductor device 1 according to the third embodiment is the same as in the first embodiment except that the shape of the signal terminal 10c is different.

As illustrated in FIG. 9A, the signal terminal 10c includes the columnar main body portion 101 and the plate-like joint portion 102. As illustrated in FIG. 9B, the joint portion 102 includes the narrow portion 16, the thin portion 14, and the through hole 18.

In a manufacturing process of the power semiconductor device 1, conduction inspection of each line of the power semiconductor element 40 is performed through use of a probe for inspection. However, when the conduction inspection is performed, the probe is brought into contact with the main body portion 101 of the signal terminal 10a and the signal terminal 10b from the Z direction or the Y direction, and hence there is a risk in that the main body portion 101 may be bent in the case of the power semiconductor device 1 according to the first embodiment and the second embodiment.

In view of the foregoing, in the power semiconductor device 1 according to the third embodiment, an exposed surface 20 exposed from the terminal block 50 is formed on the base portion B of the signal terminal 10c so that the inspection can be performed by bringing the probe into contact with the exposed surface 20. With this, the inspection can be performed without bringing the probe into contact with the main body portion 101 of the signal terminal 10c. Further, both the access direction of the probe to the exposed surface 20 and the access direction of the probe to a pattern surface 40a of the power semiconductor element 40 are the Z direction, and hence an inspection facility can be simplified. Thus, the inspection steps can be further made efficient.

Fourth Embodiment

Figure 11A:
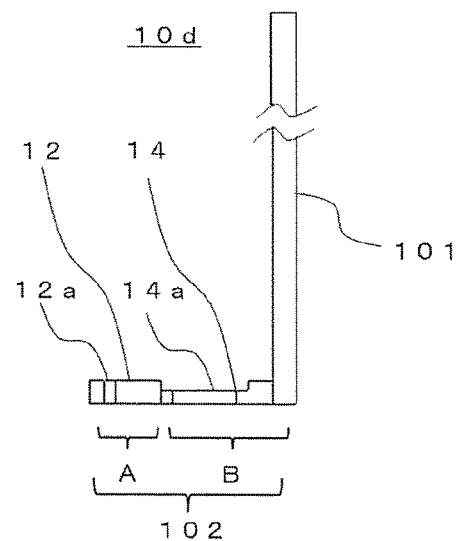
FIG. 11A is a side view of a signal terminal in a power semiconductor device according to a fourth embodiment of the present invention.
Figure 11B:
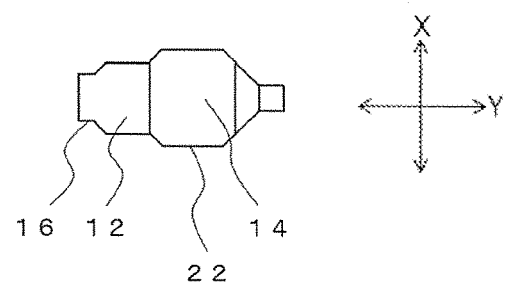
FIG. 11B is a top view of the signal terminal in the power semiconductor device according to the fourth embodiment.
Figure 11C:
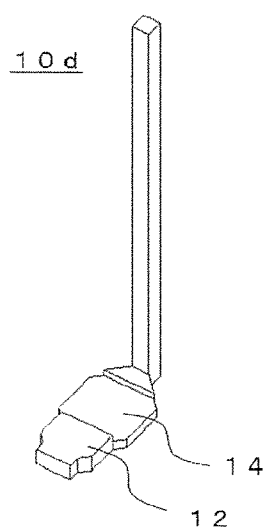
FIG. 11C is a perspective view of the signal terminal in the power semiconductor device according to the fourth embodiment.

FIG. 11A to FIG. 11C area side view, a top view, and a perspective view for illustrating a signal terminal 10d in a fourth embodiment of the present invention, respectively. As illustrated in FIG. 11A and FIG. 11B, the signal terminal 10d includes the narrow portion 16 and the thin portion 14 in the joint portion 102. Further, as illustrated in FIG. 11B, the thin portion 14 of the signal terminal 10d includes a wide portion 22 in which a width in the X direction is set to be larger than that of the pad portion 12.

The wide portion 22 is formed in the thin portion 14, and hence the periphery of the wide portion 22 is covered with the resin material 70 forming the terminal block 50. The outer appearance of the power semiconductor device 1 is the same as the power semiconductor device 1 using the signal terminal 10a illustrated in FIG. 2. Thus, the creepage distance for insulation between the adjacent signal terminals 10d remains unchanged. With this, the vibration in the Y direction of the pad portion 12 of the signal terminal 10d can be further suppressed without changing the creepage distance for insulation between the adjacent signal terminals 10d. It is preferred that the width of the wide portion 22 be set to be 1.1 times that of the pad portion 12 or more.

Fifth Embodiment

Figure 12A:
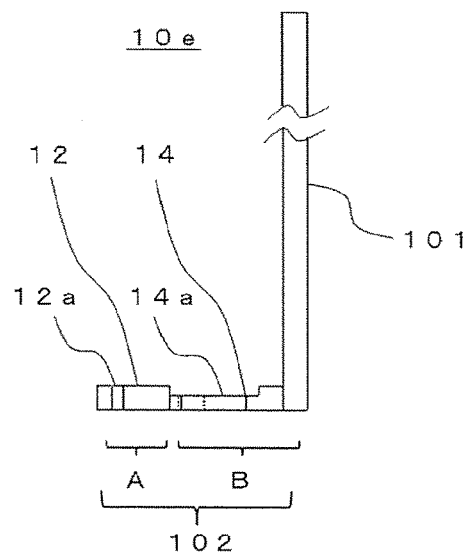
FIG. 12A is a side view of a signal terminal in a power semiconductor device according to a fifth embodiment of the present invention.
Figure 12B:
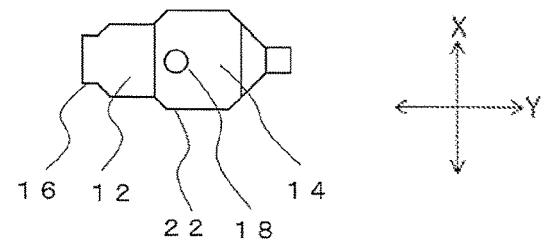
FIG. 12B is a top view of the signal terminal in the power semiconductor device according to the fifth embodiment.
Figure 12C:
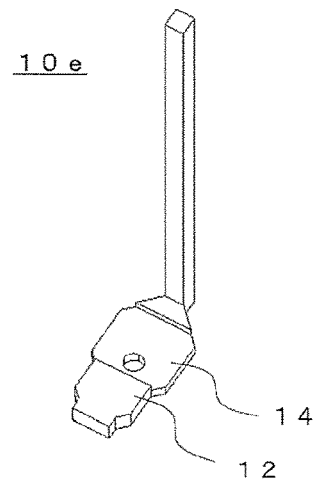
FIG. 12C is a perspective view of the signal terminal in the power semiconductor device according to the fifth embodiment.

FIG. 12A to FIG. 12C area side view, a top view, and a perspective view for illustrating a signal terminal 10e in a fifth embodiment of the present invention, respectively. The signal terminal 10e in the fifth embodiment includes the narrow portion 16, the thin portion 14, and the through hole 18 in the joint portion 102. As illustrated in FIG. 12B, the thin portion 14 of the signal terminal 10e includes the wide portion 22 in which a width in the X direction is set to be larger than that of the pad portion 12.

Sixth Embodiment

Figure 13A:
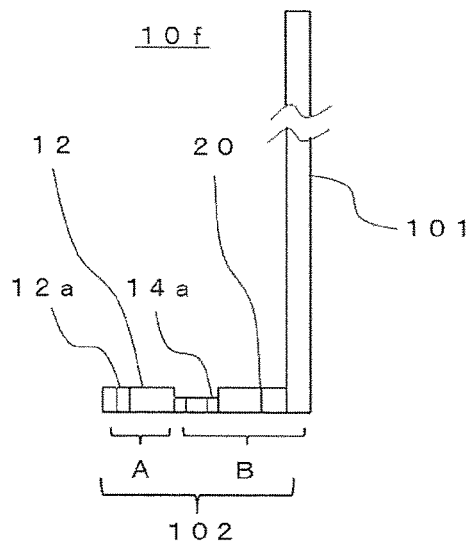
FIG. 13A is a side view of a signal terminal in a power semiconductor device according to a sixth embodiment of the present invention.
Figure 13B:
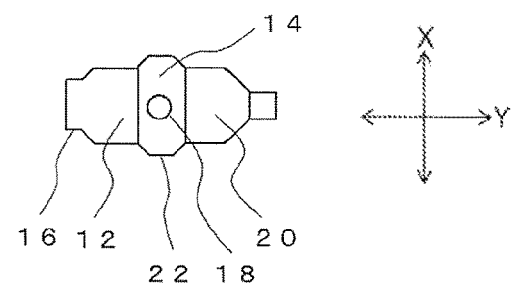
FIG. 13B is a top view of the signal terminal in the power semiconductor device according to the sixth embodiment.
Figure 13C:
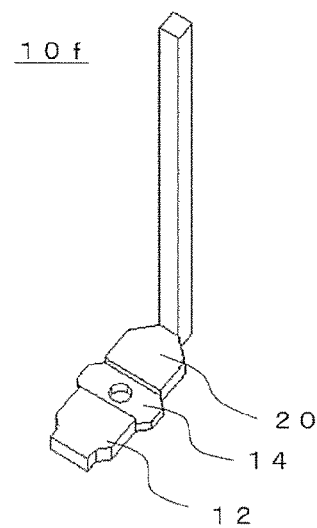
FIG. 13C is a perspective view of the signal terminal in the power semiconductor device according to the sixth embodiment.

FIG. 13A to FIG. 13C area side view, a top view, and a perspective view for illustrating a signal terminal 10f in a sixth embodiment of the present invention, respectively. The signal terminal 10f includes, in the joint portion 102, the narrow portion 16, the thin portion 14, the through hole 18 penetrating through the thin portion 14 in the Z direction, and the exposed surface 20 that is partially exposed from the terminal block 50. As illustrated in FIG. 12B, the thin portion 14 of the signal terminal 10f includes the wide portion 22 in which a width in the X direction is set to be larger than that of the pad portion 12.

Seventh Embodiment

Figure 14A:
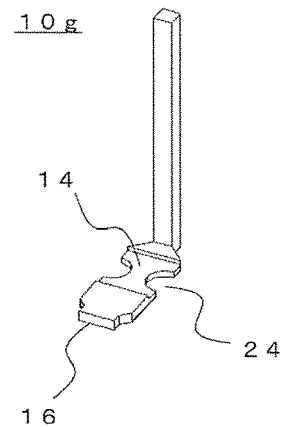
FIG. 14A is a perspective view of a signal terminal in a power semiconductor device according to a seventh embodiment of the present invention.
Figure 14B:
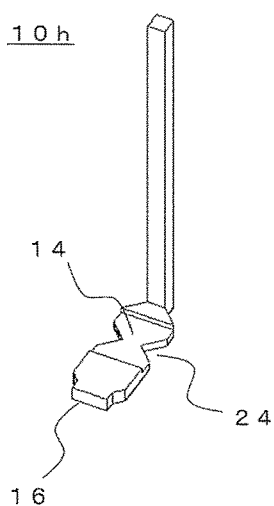
FIG. 14B is a perspective view of the signal terminal in the power semiconductor device according to the seventh embodiment.
Figure 14C:
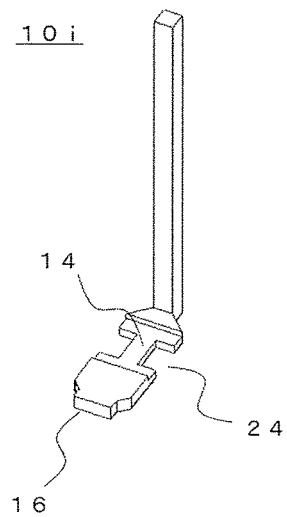
FIG. 14C is a perspective view of the signal terminal in the power semiconductor device according to the seventh embodiment.

FIG. 14A to FIG. 14C are perspective views for illustrating signal terminals 10g to 10i in a seventh embodiment of the present invention, respectively. In the signal terminals 10g to 10i, a semicircular cutout portion 24, a triangular cutout portion 24, and a rectangular cutout portion 24 are formed on both side surfaces of the thin portion 14 instead of the through hole 18 of the signal terminal 10b in the second embodiment. In the signal terminals 10g to 10i, the width of the thin portion 14 is partially reduced due to the presence of the cutout portion 24.

In the seventh embodiment, the cutout portion 24 is formed instead of the through hole 18 of the signal terminal 10b in the second embodiment, but the cutout portion 24 may be formed in addition to the through hole 18. Further, in the seventh embodiment, the cutout portion 24 is formed in the thin portion 14 in which a width in the horizontal direction is the same as that of the pad portion 12, but the cutout portion 24 may be formed in the wide portion 22 of the signal terminal 10d illustrated in FIG. 11B.

REFERENCE SIGNS LIST 1 power semiconductor device, 10a to 10i signal terminal, 101 main body portion, 102 joint portion, 12 pad portion, 12a upper surface, 14 thin portion, 14a upper surface, 16 narrow portion, 18 through hole, 20 exposed surface, 22 wide portion, 24 cutout portion, 30 signal line, 40 power semiconductor element, 50 terminal block, 60 substrate, 70 resin material, A distal end portion, B base portion

The invention claimed is:

1. A power semiconductor device, comprising:
a signal terminal; and
a power semiconductor element,
wherein the power semiconductor element is arranged on a substrate,
wherein the signal terminal includes a main body portion and a joint portion, and a part of the signal terminal is held by a terminal block,
wherein the joint portion includes a distal end portion and a base portion,
wherein the distal end portion includes a pad portion that is exposed from the terminal block and connected to a signal line,
wherein the base portion includes a thin portion in which a thickness is set to be smaller than a thickness of the pad portion, and
wherein the thin portion has an upper surface formed at a position lower than an upper surface of the pad portion, and the upper surface of the thin portion is covered with a resin material forming the terminal block up to a position lower than the upper surface of the pad portion.

2. A power semiconductor device according to claim 1, wherein the distal end portion includes a narrow portion in which a width in a horizontal direction is set to be smaller than a width of the pad portion.

3. A power semiconductor device according to claim 1, wherein the thin portion has a through hole penetrating through the thin portion in a vertical direction, and wherein the through hole is filled with the resin material forming the terminal block.

4. A power semiconductor device according to claim 2, wherein the thin portion has a through hole penetrating through the thin portion in a vertical direction, and wherein the through hole is filled with the resin material forming the terminal block.

5. A power semiconductor device according to claim 1, wherein the thin portion includes a wide portion in which a width in a horizontal direction is set to be larger than a width of the pad portion.

6. A power semiconductor device according to claim 2, wherein the thin portion includes a wide portion in which a width in a horizontal direction is set to be larger than a width of the pad portion.

7. A power semiconductor device according to claim 3, wherein the thin portion includes a wide portion in which a width in a horizontal direction is set to be larger than a width of the pad portion.

8. A power semiconductor device according to claim 4, wherein the thin portion includes a wide portion in which a width in a horizontal direction is set to be larger than a width of the pad portion.

9. A power semiconductor device according to claim 1, wherein the thin portion includes a cutout portion, and wherein the cutout portion is filled with the resin material forming the terminal block.

10. A power semiconductor device according to claim 2, wherein the thin portion includes a cutout portion, and wherein the cutout portion is filled with the resin material forming the terminal block.

11. A power semiconductor device according to claim 1, wherein the base portion includes an exposed surface in which a part of the signal terminal is exposed.

12. A power semiconductor device according to claim 2, wherein the base portion includes an exposed surface in which a part of the signal terminal is exposed.

13. A power semiconductor device according to claim 3, wherein the base portion includes an exposed surface in which a part of the signal terminal is exposed.

14. A power semiconductor device according to claim 4, wherein the base portion includes an exposed surface in which a part of the signal terminal is exposed.

15. A power semiconductor device according to claim 5, wherein the base portion includes an exposed surface in which a part of the signal terminal is exposed.

16. A power semiconductor device according to claim 6, wherein the base portion includes an exposed surface in which a part of the signal terminal is exposed.

17. A power semiconductor device according to claim 7, wherein the base portion includes an exposed surface in which a part of the signal terminal is exposed.

18. A power semiconductor device according to claim 8, wherein the base portion includes an exposed surface in which a part of the signal terminal is exposed.

19. A power semiconductor device according to claim 9, wherein the base portion includes an exposed surface in which a part of the signal terminal is exposed.

20. A power semiconductor device according to claim 10, wherein the base portion includes an exposed surface in which a part of the signal terminal is exposed.

* * * * *